US012780739B2

(12) United States Patent
Hirose et al.

(10) Patent No.: US 12,780,739 B2
(45) Date of Patent: Nov. 3, 2026

(54) LEAD-FREE PIEZOELECTRIC CERAMIC COMPOSITION AND PIEZOELECTRIC ELEMENT

(71) Applicant: NITERRA CO., LTD., Nagoya (JP)

(72) Inventors: Yoshinobu Hirose, Nagoya (JP); Ryosuke Kobayashi, Nagoya (JP); Takashi Kasashima, Nagoya (JP); Masato Yamazaki, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 525 days.

(21) Appl. No.: 18/578,172

(22) PCT Filed: May 24, 2022

(86) PCT No.: PCT/JP2022/021187
§ 371 (c)(1),
(2) Date: Jan. 10, 2024

(87) PCT Pub. No.: WO2023/026614
PCT Pub. Date: Mar. 2, 2023

(65) Prior Publication Data

US 2024/0317646 A1 Sep. 26, 2024

(30) Foreign Application Priority Data

Aug. 27, 2021 (JP) ................................ 2021-138559

(51) Int. Cl.
*C04B 35/49* (2006.01)
*H10N 30/853* (2023.01)

(52) U.S. Cl.
CPC ......... *C04B 35/49* (2013.01); *H10N 30/8542* (2023.02); *C04B 2235/3249* (2013.01);
(Continued)

(58) Field of Classification Search
CPC .... C04B 2235/3262; C04B 2235/3251; C04B 2235/3244; C04B 2235/3236;
(Continued)

(56) References Cited

U.S. PATENT DOCUMENTS 7,585,429 B2 * 9/2009 Katayama ............ H10N 30/853
501/134
9,006,959 B2 * 4/2015 Yamazaki .......... H10N 30/8542
252/62.9 R (Continued)

FOREIGN PATENT DOCUMENTS

CN 101239824 B 8/2010
EP 2980040 A1 2/2016

(Continued)

OTHER PUBLICATIONS

Office Action dated Jan. 20, 2026, issued by Taiwanese Patent Office in Taiwanese Patent Application No. 111131450.

(Continued)

*Primary Examiner* — Pedro J Cuevas
(74) *Attorney, Agent, or Firm* — Sughrue Mion, PLLC

(57) ABSTRACT

A lead-free piezoelectric ceramic composition which includes a primary phase formed of an alkali niobate-based perovskite oxide represented by a compositional formula $(A1_aM1_b)_c(Nb_{d1}, Mn_{d2}, M2_{d3})O_{3+e}$ (in which element A1 represents at least one species among the alkali metals; element M1 represents at least one species among Ba, Ca, and Sr; element M2 represents at least one species of Ti and Zr; the following conditions: $0<a<1$, $0<b<1$, $a+b=1$, $0.80<c<1.10$, $0<d1<1$, $0<d2<1$, $0<d3<1$, and $d1+d2+d3=1$, are satisfied; and e represents a value showing the degree of deficiency or excess of oxygen) and which satisfies the condition: $b/(d2+d3)>1.0$.

12 Claims, 1 Drawing Sheet

(52) U.S. Cl.
CPC ............................ *C04B 2235/3255* (2013.01); *C04B 2235/768* (2013.01); *C04B 2235/785* (2013.01); *C04B 2235/786* (2013.01)

(58) Field of Classification Search
CPC .... C04B 2235/3232; C04B 2235/3208; C04B 2235/3203; C04B 2235/768; C04B 2235/3255; C04B 35/49; C04B 2235/3249; H10N 30/8536; H10N 30/853; H10N 30/20; H10N 30/8542; C01G 33/00
See application file for complete search history.

(56) References Cited

U.S. PATENT DOCUMENTS

| | | | | |
|---|---|---|---|---|
| 9,590,168 | B2 * | 3/2017 | Kobayashi | C04B 35/495 |
| 9,828,296 | B2 * | 11/2017 | Yamazaki | H10N 30/097 |
| 9,938,197 | B2 * | 4/2018 | Yamazaki | C04B 35/495 |
| 10,340,441 | B2 * | 7/2019 | Kozuka | C04B 35/495 |
| 10,347,817 | B2 * | 7/2019 | Kozuka | H10N 30/87 |
| 10,629,322 | B2 * | 4/2020 | Kozuka | G01N 29/022 |
| 2002/0190237 | A1 * | 12/2002 | Helke | H10N 30/853 252/62.9 PZ |
| 2007/0120446 | A1 * | 5/2007 | Yamazaki | H10N 30/8542 310/358 |
| 2008/0061263 | A1 | 3/2008 | Kawada et al. | |
| 2008/0290316 | A1 * | 11/2008 | Katayama | C04B 35/495 252/62.9 PZ |
| 2012/0146462 | A1 | 6/2012 | Yamazaki et al. | |
| 2014/0139070 | A1 * | 5/2014 | Yamazaki | H10N 30/8542 252/62.9 PZ |
| 2016/0052826 | A1 | 2/2016 | Yamazaki et al. | |
| 2017/0141292 | A1 | 5/2017 | Kozuka et al. | |
| 2017/0141293 | A1 * | 5/2017 | Kozuka | H10N 30/87 |
| 2018/0330843 | A1 * | 11/2018 | Kozuka | H01B 1/08 |
| 2020/0169191 | A1 | 5/2020 | Kubota et al. | |
| 2024/0065107 | A1 * | 2/2024 | Hirose | H10N 30/50 |
| 2024/0308917 | A1 * | 9/2024 | Hirose | C04B 35/495 |
| 2026/0033245 | A1 * | 1/2026 | Ito | H10N 30/067 |
| 2026/0035305 | A1 * | 2/2026 | Hirose | C04B 35/495 |
| 2026/0090273 | A1 * | 3/2026 | Ikeo | H10N 30/508 |

FOREIGN PATENT DOCUMENTS

| | | | | | |
|---|---|---|---|---|---|
| JP | 4929522 | B2 | | 5/2012 | |
| JP | 2014-111529 | A | | 6/2014 | |
| JP | 2019-33254 | A | | 2/2019 | |
| JP | 2019-54101 | A | | 4/2019 | |
| JP | 2022178888 | A | * | 12/2022 | C04B 35/495 |
| JP | 7696754 | B2 | * | 6/2025 | C04B 35/495 |
| KR | 10-2015-0133261 | A | | 11/2015 | |
| WO | WO-2005061413 | A1 | * | 7/2005 | C04B 35/63 |
| WO | 2022/215666 | A1 | | 10/2022 | |

OTHER PUBLICATIONS

Communication dated Sep. 4, 2025 issued by the European Patent Office in European Patent Application No. 22859545.0.

Communication dated Sep. 5, 2025 issued by the State Intellectual Property Office of People's Republic of China in Chinese Patent Application No. 202280055766.2.

Guifang Han et al., "Hardening behavior of Mn-modified KNN-BT thick films fabricated by aerosol deposition", Materials Letters, vol. 65, No. 2, Oct. 1, 2010, doi:10.1016/j.matlet.2010.09.077, pp. 278-281 (4 pages total).

Enzhu Li et al., "Effect of Manganese Addition on Piezoelectric Properties of the (K, Na, Li)(Nb, Ta, Sb)O3 Lead-Free Ceramics", Journal of the Ceramic Society of Japan, vol. 115, No. 4, Apr. 1, 2007, pp. 250-253 (4 pages total).

Office Action issued on Dec. 10, 2024 by the Korean Intellectual Property Office in the Korean Patent Application No. 10-2023-7043470.

International Search Report (PCT/ISA/210) dated Aug. 16, 2022, issued by the International Searching Authority in counterpart International Application No. PCT/JP2022/021187.

International Preliminary Report on Patentability (Chapter II of the Patent Cooperation Treaty) (PCT/IPEA/409) dated Mar. 17, 2023, issued by the International Preliminary Examining Authority in counterpart International Application No. PCT/JP2022/021187.

* cited by examiner

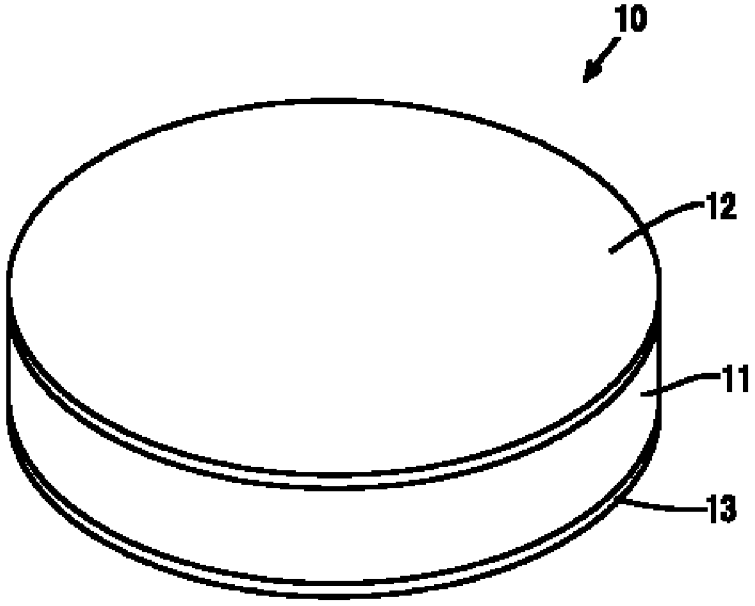
10
12
11
13

LEAD-FREE PIEZOELECTRIC CERAMIC COMPOSITION AND PIEZOELECTRIC ELEMENT

CROSS-REFERENCE TO RELATED APPLICATIONS

This application is a National Phase Entry of PCT International Application No. PCT/JP2022/021187 filed on May 24, 2022, which claims priority to Japanese Patent Application No. 2021-138559 filed on Aug. 27, 2021.

TECHNICAL FIELD

The techniques disclosed by the present specification relate to a lead-free piezoelectric magnetic composition and a method for producing a piezoelectric element.

BACKGROUND ART

Hitherto, PZT (lead zirconate titanate) has been widely used as a ceramic material exhibiting piezoelectricity. However, PZT, containing a lead component, evokes a problematic impact on the environment. Thus, in recent years, development of a lead-free piezoelectric ceramic material has been pursued. One promising candidate of the lead-free piezoelectric ceramic material is a lead-free piezoelectric ceramic composition having a primary phase containing an alkali metal niobate-based perovskite oxide.

When such a lead-free piezoelectric ceramic composition is applied to devices such as a piezoelectric filter, a piezoelectric transducer, a piezoelectric transducer, a piezoelectric ultrasonic motor, a piezoelectric gyro sensor, and a knocking sensor, a high mechanical quality factor Qm is required. Various studies have shown that a lead-free piezoelectric ceramic composition exhibiting high mechanical quality factor Qm can be obtained by adding manganese (Mn) to an alkaline niobate-base perovskite oxide (see, Patent Document 1).

CITATION LIST

Patent Literature

Patent Literature 1: JP 4929522B

SUMMARY OF INVENTION

Technical Problem

There is demand for applying the aforementioned lead-free piezoelectric ceramic composition to, for example, piezoelectric elements which must exhibit high mechanical quality factor Qm (e.g., a bolted Langevin-type ultrasonic transducer). Thus, characteristics of lead-free piezoelectric ceramic compositions are required to be further improved.

Solution to Problem

The present specification discloses a lead-free piezoelectric magnetic composition which includes a primary phase formed of an alkali niobate-based perovskite oxide represented by a compositional formula $(A1_aM1_b)_c(Nb_{d1}, Mn_{d2}, M2_{d3})O_{3+e}$ (in which element A1 represents at least one species among the alkali metals; element M1 represents at least one species among Ba, Ca, and Sr; element M2 represents at least one species of Ti and Zr; the following conditions: $0<a<1$, $0<b<1$, $a+b=1$, $0.80<c<1.10$, $0<d1<1$, $0<d2<1$, $0<d3<1$, and $d1+d2+d3=1$, are satisfied; and e represents a value showing the degree of deficiency or excess of oxygen) and which satisfies the condition: $b/(d2+d3)>1.0$.

The present specification also discloses a piezoelectric element including a piezoelectric body formed of the aforementioned lead-free piezoelectric ceramic composition, and an electrode being in contact with the piezoelectric body.

Advantageous Effects of Invention

According to the lead-free piezoelectric magnetic composition and the piezoelectric element which are disclosed in the present specification, a high mechanical quality factor Qm can be attained.

BRIEF DESCRIPTION OF DRAWINGS

The FIGURE is a perspective view of a piezoelectric element of an embodiment.

DESCRIPTION OF EMBODIMENTS

Summary of Embodiment (1) A lead-free piezoelectric ceramic composition disclosed by the present specification includes a primary phase formed of an alkali niobate-based perovskite oxide represented by a compositional formula $(A1_aM1_b)_c(Nb_{d1}, Mn_{d2}, M2_{d3})O_{3+e}$ (in which element A1 represents at least one species among the alkali metals; element M1 represents at least one species among Ba, Ca, and Sr; element M2 represents at least one species of Ti and Zr; the following conditions: $0<a<1$, $0<b<1$, $a+b=1$, $0.80<c<1.10$, $0<d1<1$, $0<d2<1$, $0<d3<1$, and $d1+d2+d3=1$, are satisfied; and e represents a value showing the degree of deficiency or excess of oxygen) and which satisfies the condition: $b/(d2+d3)>1.0$.

A piezoelectric element disclosed by the present specification includes a piezoelectric body formed of the aforementioned lead-free piezoelectric ceramic composition, and an electrode being in contact with the piezoelectric body.

In the alkali niobate-based perovskite oxide, when Mn serving as an acceptor forms a solid solution in Nb sites, mechanical quality factor Qm is conceivably enhanced. However, difficulty is encountered in formation of a solid solution of Mn with an alkali niobate-based perovskite oxide, and Mn tends to segregate to form a foreign phase in the lead-free piezoelectric ceramic composition. Meanwhile, Ba, Ca, and Sr are divalent elements having a valence closer to the valence of Mn, as compared with alkali metals. Thus, it is assumed that, when Ba, Ca, and Sr are incorporated into alkali sites to form a solid solution, Mn promotes to form a solid solution in Nb sites. By adjusting the compositional proportions of Ba, Ca, and Sr to Mn to be $b/(d2+d3)>1.0$, conceivably, an appropriate amount of Mn forms a solid solution in Nb sites, to thereby enhance mechanical quality factor Qm.

(2) The lead-free piezoelectric ceramic composition of (1) above may further include a secondary phase formed of one member of an oxide represented by compositional formula $A2_{1-x}Ti_{1-x}Nb_{1+x}O_5$ (in which element A2 is at least one species among the alkali metals, and the condition: $0\leq x\leq 0.15$ is satisfied) and an oxide represented by compositional formula $A3Ti_3NbO_9$ (in which element A3 is at least one species among the alkali metals).

According to the above technical feature, the piezoelectric performance can be further enhanced, as compared with the case in which the lead-free piezoelectric ceramic composition includes no secondary phase.

(3) In the lead-free piezoelectric ceramic composition of (1) above, the primary phase may contain crystal grains of the alkali niobate-based perovskite oxide having a mean grain size of 0.3 μm or more and 3.5 μm or less.

Alternatively, in the lead-free piezoelectric ceramic composition of (1) above, the primary phase may contain crystal grains of the alkali niobate-based perovskite oxide having a mean grain size of 0.3 μm or more and 1.1 μm or less.

According to the above technical feature, mechanical quality factor Qm can be further enhanced.

Details of Embodiment

Specific examples of the techniques disclosed in the present specification will now be described with reference to the FIGURE. Notably, the examples should not be construed as limiting the invention thereto, and the scope of the present invention is defined by the claims. It is also intended that the present invention encompasses all modifications within the meanings and scopes equivalent to those of the claims.

Embodiment

[Technical Feature of Lead-Free Piezoelectric Magnetic Composition]

The lead-free piezoelectric ceramic composition of the embodiment includes a primary phase formed of an alkali niobate-based perovskite oxide which exhibits a piezoelectric property. The alkali niobate-based perovskite oxide of the present embodiment is represented by the following compositional formula (1).

$$(A1_aM1_b)(Nb_{d1},Mn_{d2},M2_{d3})O_{3+e} \quad (1)$$

Element A1 is at least one species among alkali metals, and element M1 is at least one species among alkaline earth metals of Ca (calcium), Sr (strontium), and Ba (barium). Element M2 is at least one of Ti (titanium) and Zr (zirconium).

In the above compositional formula (1), element A1 and element M1 are located in A sites (alkali sites) of the perovskite structure, and Nb (niobium), Mn (manganese), and element M2 are located in B sites.

In the compositional formula (1), coefficients a to e are selected from the values which are preferred from the viewpoints of electrical characteristics and piezoelectric characteristics (in particular, piezoelectric constant $d_{33}$) of the lead-free piezoelectric ceramic composition, so long as the coefficients a to e ensure establishment of the perovskite structure.

Specifically, coefficients a and b satisfy the conditions: $0<a<1$, $0<b<1$, and $a+b=1$. However, the cases of $a=0$ (i.e., the composition containing no alkali metal) and $b=0$ (i.e., the composition containing none of Ca, Sr, and Ba) are excluded.

Coefficient c with respect to the entire A sites satisfies $0.80<c<1.10$, and is preferably $0.84\leq c\leq 1.08$, more preferably $0.88\leq c\leq 1.07$.

Coefficients d1, d2, and d3 satisfy the conditions: $0<d1<1$, $0<d2<1$, $0<d3<1$, and $d1+d2+d3=1$. However, the cases of $d1=0$ (i.e., the composition containing no Nb, $d2=0$ (i.e., the composition containing no Mn), and $d3=0$ (i.e., the composition containing no Ti or Zr) are excluded.

In coefficient (3+e) with respect to oxygen, the value of e is a positive or negative value showing deviation (deficiency or excess) from the intrinsic value of 3 with respect to oxygen. Coefficient (3+e) with respect to oxygen may be a value which allows the primary phase to have a perovskite oxide structure. Typically, coefficient e is 0, and preferably satisfies $0\leq e\leq 0.1$. Notably, coefficient e may also be calculated from the composition of the primary phase to meet the electrically neutral condition. However, needless to say, a composition of the primary phase which is slightly deviated from the electrically neutral condition is also allowable.

Coefficients b, d2, and d3 satisfy the condition: $b/(d2+d3)>1.0$. When coefficients b, d2, and d3 satisfy the condition, a lead-free piezoelectric ceramic composition which exhibits high mechanical quality factor Qm can be yielded. A conceivable reason for this is as follows.

Conceivably, when Mn serving as an acceptor forms a solid solution in Nb sites, mechanical quality factor Qm can be enhanced. However, difficulty is encountered in formation of a solid solution of Mn with an alkali niobate-based perovskite oxide, and Mn tends to segregate to form a foreign phase in the lead-free piezoelectric ceramic composition. Solid solution-formability is thought to depend on the ionic radius and valence of a metal atom involved in formation of solid solution, and difficulty is encountered in forming a solid solution of trivalent Mn in B sites where pentavalent Nb mainly occupies. Meanwhile, divalent metals Ba, Ca, and Sr easily form a solid solution in A sites allocated for monovalent alkali metals. It is assumed that, when appropriate amounts of Ba, Ca, and Sr having a valence closer to the valence of Mn are incorporated into A sites to form a solid solution, formation of a solid solution of Mn in B sites is facilitated. Thus, conceivably, by adjusting the compositional proportions of Ba, Ca, and Sr to Mn to be $b/(d2+d3)>1.0$, an appropriate amount of Mn forms a solid solution in B sites, thereby enhancing mechanical quality factor Qm.

No particular limitation is imposed on the upper limit of $b/(d2+d3)$, but the ratio $b/(d2+d3)$ is preferably 2.0 or less.

The alkali niobate-based perovskite oxide represented by the aforementioned compositional formula (1) preferably contains, as element A1, at least one species among K (potassium), Na (sodium), and Li (lithium). When the above oxide contains at least one species of K, Na, and Li as element A1, a, Sr, and Ba as element M1, and at least one species of Ti and Zr, compositional formula (1) can be transformed into the following compositional formula (1a).

$$(K_{a1}Na_{a2}Li_{a3}Ca_{b1},Sr_{b2},Ba_{b3})_c(Nb_{a1},Mn_{d2},Ti_{d31},Zr_{d32})O_{3+e} \quad (1a)$$

The aforementioned compositional formula (1) is equivalent to the above formula (1a), and the conditions: $a1+a2+a3=a$; $b1+b2+b3=b$; and $d31+d32=d$ are satisfied. Typically, coefficients a1 and a2 with respect to K and Na satisfy the conditions: $0<a1\leq 0.6$ and $0<a2\leq 0.6$, respectively. Coefficient a3 with respect to Li may be 0 and is preferably $0<a3e\leq 0.2$, more preferably $0<a3e\leq 0.1$.

Among the alkali niobate-based perovskite oxides represented by compositional formula (1a), those containing K, Na, and Nb as main metallic components are called "KNN" or "KNN material." A lead-free piezoelectric magnetic composition, which is produced by use of such an oxide, can exert excellent piezoelectric characteristics, electric characteristics, insulation performance, and durability at high temperatures and does not exhibit steep variation in these characteristics within a temperature range of −50° C. to +150° C. A typical composition of the primary phase is $(K, Na, Li, Ca, Ba)_c(Nb, Mn, Ti, Zr)O_{3+e}$.

The lead-free piezoelectric ceramic composition of this embodiment may further include a secondary phase formed of one member of an oxide represented by the following compositional formula (2) and an oxide represented by the following compositional formula (3).

$$A2_{1-x}Ti_{1-x}Nb_{1+x}O_5 \quad (2)$$

$$A3Ti_3NbO_9 \quad (3)$$

In compositional formula (2), element A2 is at least one species among alkali metals, preferably at least one species among K, Rb (rubidium), and Cs (cesium). Coefficient x satisfies the condition: $0 \leq x \leq 0.15$. When coefficient x satisfies this condition, the secondary phase has a stable structure, thereby yielding a uniform crystalline phase. From the viewpoint of structural stability of the secondary phase, coefficient x preferably satisfies the condition: $0 \leq x \leq 0.15$ in the case in which element A2 is K or Rb, and the condition: $0 \leq x \leq 0.10$ in the case in which element A2 is Cs.

In compositional formula (3), element A3 is at least one species among alkali metals, preferably at least one species among K, Rb, and Cs.

The secondary phase itself has no piezoelectric property. However, when the secondary phase is co-present with the primary phase, sinterability and insulation performance can be enhanced. Also, the secondary phase may prevent phase transition within a range of −50° C. to +150° C. The secondary phase assumes a compound having a layer structure (i.e., a layer compound). Conceivably, the layer structure of the compound may be a factor for enhancing insulation performance of the piezoelectric ceramic composition and preventing phase transition.

The secondary phase content may be more than 0 mol % and less than 20 mol %, and is preferably 2 mol % or more and 15 mol % or less, more preferably 2 mol % or more and 10 mol % or less.

Among the oxides represented by compositional formula (2) or (3), those containing Nb, Ti, and K as main metallic components are called "NTN material." By use of such an oxide, a lead-free piezoelectric magnetic composition which is inexpensive and exhibits excellent piezoelectric characteristics can be provided.

[Piezoelectric Element 10]

A piezoelectric element 10 of the present embodiment has a piezoelectric body 11, and electrodes 12, 13 which are in contact with the piezoelectric body 11. The piezoelectric body 11 is formed of the aforementioned lead-free piezoelectric ceramic composition and has a disk shape. Of the electrodes 12 and 13, one electrode is disposed on one surface of the piezoelectric body 11, and the other is disposed on another surface of the piezoelectric body 11. Thus, the piezoelectric body 11 is sandwiched between the electrodes 12 and 13.

An example of the method of producing the aforementioned piezoelectric element 10 will next be described.

First, essential ingredients for producing a primary phase are chosen from powder-form raw materials, and weighed so as to attain a target composition. The powder-form raw materials may be an oxide, a carbonate salt, or a hydroxide of an element forming the primary phase. To the thus-prepared powder raw materials, ethanol is added, and the mixture was subjected to wet mixing by means of a ball mill preferably for 15 hours or longer, to thereby yield a slurry. The slurry was dried to form a powder of mixture and the powder is calcined under the conditions, for example, 600 to 1,000° C. in air for 1 to 10 hours, to thereby obtain a calcined product of primary phase.

Separately, essential ingredients for producing a secondary phase are chosen from powder-form raw materials, and weighed so as to attain a target composition. The powder-form raw materials may be an oxide, a carbonate salt, or a hydroxide of an element forming the secondary phase. To these powder-form raw materials, ethanol is added, and the mixture is agitated under wet conditions by means of a ball mill for preferably 15 hours or longer, to thereby prepare a slurry. The thus-prepared slurry is dried, and the dry powder mixture is calcined at, for example, 600 to 1,000° C. in air for 1 to 10 hours, to thereby yield a calcined product of the secondary phase.

Subsequently, the calcined products of the primary phase and secondary phase are weighed. Both components are mixed with a dispersant, a binder and ethanol, and the mixture is pulverized and mixed, to thereby give a slurry. If needed, another powder-form raw material which has not been selected to providing the aforementioned calcined products of the primary and secondary phases may be weighed and added to the slurry. Notably, the slurry may be further subjected to calcination, pulverization, and mixing. The thus-obtained slurry is dried, and the product was granulated and monoaxially pressed at a pressure, for example, 20 MPa, to thereby provide a compact of a shape of interest. The thus-obtained compact is subjected to a cold isostatic pressing (CIP) treatment at, for example, 150 MPa. The CIP product is fired under conditions, for example, of 900 to 1,300° C. for 1 to 10 hours in air, to thereby form a piezoelectric body. The firing may also be performed in an oxygen atmosphere.

Thereafter, electrodes are formed on the surface of the dielectric body through a technique, such as sputtering, and the product is subjected to a polarization treatment, to thereby fabricate a piezoelectric element.

Notably, the production method as described above is a merely an exemplary method, and various other steps and treatment conditions for producing a piezoelectric element may be employed. In the above production procedure, a calcined product of the primary phase and that of the secondary phase are separately formed, and the two powder products are mixed, followed by firing. However, in an alternative method, raw materials of the primary phase and those of the secondary phase are mixed at such a ratio that the target compositional proportions of the finally obtained lead-free piezoelectric ceramic composition are attained, and the thus-prepared mixture is fired. Through the former method (i.e., separately forming a calcined product of the primary phase and that of the secondary phase and mixing the two products), rigorous control of the composition of the primary phase and that of the secondary phase can be easily achieved, whereby the yield of the lead-free piezoelectric ceramic composition can be enhanced.

The lead-free piezoelectric ceramic composition and the piezoelectric element according to the present embodiment find various uses including vibration sensing, pressure sensing, oscillation, and piezoelectric devices. Specific examples include sensors for detecting various vibrations (e.g., a knocking sensor and a combustion pressure sensor); piezoelectric devices such as an oscillator, an actuator, and a filter; high-voltage generators; micro power supplies; driving units; position control systems; vibration dampers; and fluid discharge systems (e.g., a paint ejector and a fuel ejector). In addition, the lead-free piezoelectric ceramic composition and the piezoelectric element according to the present embodiment are particularly suitable for uses requiring extremely high heat resistance (e.g., a knocking sensor and a combustion pressure sensor).

Test Examples

1. Sample Preparation (1) First Calcination Step

Powders of $K_2CO_3$, $Na_2CO_3$, $Li_2CO_3$, and $Nb_2O_5$ were weighed so that coefficients f, g, and h of the following compositional formula (4) were adjusted to specific values shown in Table 1.

$$(K_fNa_gLi_h)NbO_3 \quad (4)$$

TABLE 1

| Sample No. | f | g | h |
|---|---|---|---|
| 1 | 0.47 | 0.51 | 0.02 |
| 2 | 0.47 | 0.51 | 0.02 |
| 3 | 0.47 | 0.51 | 0.02 |
| 4 | 0.47 | 0.51 | 0.02 |
| 5 | 0.48 | 0.52 | 0.00 |
| 6 | 0.47 | 0.51 | 0.02 |
| 7 | 0.47 | 0.51 | 0.02 |
| 8 | 0.47 | 0.51 | 0.02 |
| 9 | 0.47 | 0.51 | 0.02 |
| 10 | 0.47 | 0.51 | 0.02 |
| 11 | 0.47 | 0.51 | 0.02 |
| 12 | 0.47 | 0.51 | 0.02 |
| 13 | 0.47 | 0.51 | 0.02 |
| 14 | 0.10 | 0.88 | 0.02 |

In each case, ethanol was added to the thus-prepared powder-form raw material, and the resultant mixture was agitated under wet conditions by means of a ball mill for 15 hours or longer, to thereby prepare a slurry. The slurry was dried, and the dry powder mixture was calcined at 600 to 1,000° C. in air for 1 to 10 hours, to thereby yield a first calcined product powder.

(2) Second Calcination Step

Required components selected from powders of $CaCO_3$, $SrCO_3$, $BaCO_3$, $MnO_2$, $TiO_2$, and $ZrO_2$, and were weighed so that the mole percentage of the metal (atomic) of each powder with respect to the first calcined product powder (i.e., oxide represented by the aforementioned compositional formula (4)) was adjusted to a specific value shown in Table 2. The weighed powders were added to the first calcined product powder.

TABLE 2

| | M1 component | | | M2 component | | |
|---|---|---|---|---|---|---|
| Sample No. | Ba Amount mol % | Ca Amount mol % | Sr Amount mol % | Zr Amount mol % | Ti Amount mol % | Mn Amount mol % |
| 1 | 2.5 | 3 | — | 2.5 | 2 | 1 |
| 2 | 2.5 | 3 | — | 2.5 | 2 | 3 |
| 3 | 2.5 | 3 | — | 2.5 | 2 | 5 |
| 4 | 3.5 | 3 | — | 2.5 | 2 | 1 |
| 5 | 3.5 | 3 | — | 2.5 | 2 | 1 |
| 6 | 8.5 | 3 | — | 2.5 | 2 | 5 |
| 7 | — | 6.5 | — | 2.5 | 2 | 1 |
| 8 | 3.5 | — | 3 | 2.5 | 2 | 1 |
| 9 | 1 | 3 | — | 0 | 2 | 1 |
| 10 | 2.5 | 3 | — | 1.5 | 2 | 1 |
| 11 | 5 | 3 | — | 4 | 2 | 1 |
| 12 | 3.5 | 3 | — | 2.5 | 0.5 | 1 |

TABLE 2-continued

| | M1 component | | | M2 component | | |
|---|---|---|---|---|---|---|
| Sample No. | Ba Amount mol % | Ca Amount mol % | Sr Amount mol % | Zr Amount mol % | Ti Amount mol % | Mn Amount mol % |
| 13 | 4.5 | 3 | — | 2.5 | 3 | 1 |
| 14 | 3.5 | 3 | — | 2.5 | 2 | 1 |

In each case, ethanol was added to a mixture of the powder-form raw material and the first calcined product powder, and the resultant mixture was agitated under wet conditions by means of a ball mill for 15 hours or longer, to thereby prepare a slurry. The slurry was dried, and the dry powder mixture was calcined at 600 to 1,000° C. in air for 1 to 10 hours, to thereby yield a second calcined product powder.

(3) Molding Step

A dispersant, a binder, and ethanol were added to the thus-obtained second calcined product powder, and the resultant mixture was pulverized and mixed, to thereby yield a slurry. The slurry was dried and granulated, and the granules were monoaxially pressed at 20 MPa, to thereby provide a disk-shape compact. The thus-obtained compact was subjected to a cold isostatic pressing (CIP) treatment at 150 MPa, to thereby obtain a target compact.

(4) Firing Step

In the firing step, the thus-obtained target compact was maintained in air at 1,000 to 1,300° C. for 1 to 10 hours, to thereby provide a piezoelectric body. The piezoelectric body was formed of a lead-free piezoelectric magnetic composition containing an alkali niobate-based perovskite oxide represented by the aforementioned compositional formula (1a).

(5) Electrode Formation Step

On each surface of the piezoelectric body, an Au electrode was formed through sputtering. The piezoelectric body equipped with the electrodes was placed in silicone oil at 50° C. and subjected to polarization treatment by applying an electric field of 5 kv/mm. Thus, samples Nos. 1 to 14 were obtained.

2. Test Method

Each of the produced samples was analyzed by means of an impedance analyzer (E4990A, product of Keysight Technologies). From an electrostatic capacity at room temperature and 1 kHz, dielectric constant $\varepsilon_{33}^T/\varepsilon_0$ was calculated. Also, mechanical quality factor Qm was determined through a resonance-antiresonance system. When a sample exhibited a mechanical quality factor Qm of 500 or higher, the sample was evaluated as a good (i.e., nondefective) product.

3. Results $P_{M1}/(P_{M2}+P_{Mn})$ of each sample was calculated. Here, $P_{M1}$ is a total mol % of Ba atoms, Ca atoms, and Sr atoms in the raw material powders, $P_{M2}$ is a total mol % of Ti atoms and Zr atoms in the raw material powders, and $P_{Mn}$ is a total mol % of Mn atoms in the raw material powders, which were added to the first calcined product powder in 1.(2) above. The obtained values, dielectric constants $\varepsilon_{33}^T/\varepsilon_0$, and mechanical quality factors Qm are shown in Table 3.

TABLE 3

| Sample No. | $P_{M1}/(P_{M2}+P_{Mn})$ | Dielectric constant | Mech. quality factor Qm |
|---|---|---|---|
| 1 | 1.0 | 1,050 | 250 |
| 2 | 0.7 | 965 | 467 |
| 3 | 0.6 | 908 | 450 |

TABLE 3-continued

| Sample No. | $P_{M1}/(P_{M2} + P_{Mn})$ | Dielectric constant | Mech. quality factor Qm |
|---|---|---|---|
| 4 | 1.2 | 1,094 | 530 |
| 5 | 1.2 | 1,080 | 545 |
| 6 | 1.2 | 1,263 | 613 |
| 7 | 1.2 | 1,183 | 523 |
| 8 | 1.2 | 1,300 | 518 |
| 9 | 1.3 | 963 | 521 |
| 10 | 1.2 | 1,228 | 530 |
| 11 | 1.1 | 1.350 | 505 |
| 12 | 1.6 | 1.060 | 511 |
| 13 | 1.2 | 1,123 | 514 |
| 14 | 1.2 | 728 | 553 |

Theoretically, Ba atoms, Ca atoms, and Sr atoms which are present in raw material powders completely enter the A sites of the formed alkali niobate-based perovskite oxide, and Mn atoms, Ti atoms, and Zr atoms completely enter the B sites of the formed alkali niobate-based perovskite oxide. Therefore, the mol % values of Ba atoms, Ca atoms, Sr atoms, Mn atoms, Ti atoms, and Zr atoms may correspond to the coefficients b1, b2, b3, d2, d31, and d32 with respect to Ba, Ca, Sr, Mn, Ti, and Zr, respectively, in compositional formula (1a). Also, the total mol % values of Ba atoms, Ca atoms, and Sr atoms (PMI) may correspond to the sum of coefficients b1, b2, and b3 to Ba, Ca, and Sr of compositional formula (1a) (i.e., coefficient b of compositional formula (1)). In addition, the total mol % values of Ti atoms and Zr atoms ($P_{M2}$) may correspond to the sum of coefficients d31 and d32 with respect to Ti and Zr, respectively, in compositional formula (1a) (i.e., coefficient d3 of compositional formula (1)). Thus, the equation in terms of mol %: $P_{M1}/(P_{M2}+P_{Mn})$, may be equivalent to the equation: b/(d2+d3), regarding coefficients b, d2, and d3 of compositional formula (1).

Samples Nos. 1 to 3, having a $P_{M1}(P_{M2}+P_{Mn})$ value (i.e., b/(d2+d3) value) of 1.0 or less, exhibited a mechanical quality factor Qm less than 500. In contrast, Samples Nos. 4 to 14, having a $P_{M1}(P_{M2}+P_{Mn})$ value (i.e., b/(d2+d3) value) of more than 1.0, exhibited a mechanical quality factor Qm of 500 or more, exhibiting excellent piezoelectric characteristic.

Additional Test Example—for Investigating the Relationship Between Mean Grain Size of Crystal Grains and Mechanical Quality Factor Qm 1. Sample Preparation and Test Method The procedure of the aforementioned Test Example was repeated, to thereby prepare additional test samples. However, in the first calcination step, the raw material powders were weighed so that coefficients f, g, and h of the following compositional formula (4) were adjusted to specific values shown in Table 4. In the second calcination step, the raw material powders were weighed so that the mole percentage of the metal (atomic) of each powder to be added to the first calcined product powder was adjusted to a specific value shown in Table 4. Thus, samples Nos. 15 to 22 were prepared.

TABLE 4

| | | | | M1 component | | M2 component | | | |
|---|---|---|---|---|---|---|---|---|---|
| Sample No. | f | g | h | Ba Amount mol % | Ca Amount mol % | Zr Amount mol % | Ti Amount mo1% | Mn Amount mol % | $P_{M1}/(P_{M2} + P_{Mn})$ |
| 1 | 0.47 | 0.51 | 0.02 | 2.5 | 3 | 2.5 | 2 | 1 | 1.0 |
| 4 | 0.47 | 0.51 | 0.02 | 3.5 | 3 | 2.5 | 2 | 1 | 1.2 |
| 15 | 0.47 | 0.51 | 0.02 | 3.5 | 3 | 2.5 | 2 | 1 | 1.2 |
| 16 | 0.47 | 0.51 | 0.02 | 3.5 | 3 | 2.5 | 2 | 1 | 1.2 |
| 17 | 0.48 | 0.52 | 0.00 | 3.5 | 3 | 2.5 | 2 | 1 | 1.2 |
| 18 | 0.47 | 0.51 | 0.02 | 3.5 | 3 | 2.5 | 2 | 1 | 1.2 |
| 19 | 0.47 | 0.51 | 0.02 | 3.5 | 3 | 2.5 | 2 | 1 | 1.2 |
| 20 | 0.47 | 0.51 | 0.02 | 3.5 | 3 | 2.5 | 2 | 1 | 1.2 |
| 21 | 0.47 | 0.51 | 0.02 | 2.5 | 3 | 2.5 | 2 | 1 | 1.0 |
| 22 | 0.47 | 0.51 | 0.02 | 2.5 | 3 | 2.5 | 2 | 1 | 1.0 |

Each of the above-obtained samples Nos. 15 to 22, and samples Nos. 1 and 4 of the aforementioned Test Example was observed under an SEM (×10,000). The obtained photographic image was processed by use of image processing software "imageJ." An averaged value of the grain sizes of the crystal grains included in an image (10 μm×10 μm) was employed as a mean grain size. Also, in a manner similar to that of the aforementioned Test Example, dielectric constant $\varepsilon_{33}^T/\varepsilon_0$ and mechanical quality factor Qm were determined. When a sample exhibited a mechanical quality factor Qm of 500 or higher, the sample was evaluated as a good (i.e., nondefective) product.

2. Results

The mean grain size, dielectric constant, and mechanical quality factor Qm of each sample are shown in Table 5.

TABLE 5

| Sample No. | Mean grain size μm | Dielectric constant | Mech. quality factor Qm |
|---|---|---|---|
| 1 | 2.1 | 1,050 | 250 |
| 4 | 1.7 | 1,094 | 530 |
| 15 | 1.1 | 1,042 | 560 |
| 16 | 0.5 | 980 | 612 |
| 17 | 0.3 | 983 | 648 |
| 18 | 2.8 | 1,124 | 524 |
| 19 | 3.5 | 1,141 | 510 |
| 20 | 3.8 | 1,110 | 472 |
| 21 | 1.0 | 994 | 266 |
| 22 | 4.0 | 1,107 | 245 |

Samples Nos. 1, 21, and 22, having a $P_{M1}(P_{M2}+P_{Mn})$ value (i.e., b/(d2+d3) value) of 1.0 or less, exhibited a mechanical quality factor Qm considerably less than 500. Also, sample No. 20, having a $P_{M1}(P_{M2}+P_{Mn})$ value (i.e., b/(d2+d3) value) in excess of 1.0 and a mean grain size of alkali niobate-based perovskite oxide crystal grains of 3.8 μm, exhibited a mechanical quality factor Qm slightly less than 500. In contrast, samples Nos. 4, and 15 to 19, having a $P_{M1}(P_{M2}+P_{Mn})$ value (i.e., b/(d2+d3) value) of more than 1.0 and a mean grain size of alkali niobate-based perovskite oxide crystal grains of 0.3 to 3.5 μm, exhibited a mechanical quality factor Qm of 500 or more, exhibiting excellent piezoelectric characteristic. Particularly, samples Nos. 15 to 17, having a mean grain size of alkali niobate-based perovskite oxide crystal grains of 0.3 to 1.1 μm, exhibited a mechanical quality factor Qm of 560 or more, exhibiting remarkably excellent piezoelectric characteristic.

REFERENCE SIGNS LIST

10: piezoelectric element

11: piezoelectric body

12, 13: electrode

The invention claimed is:

1. A lead-free piezoelectric ceramic composition which comprises a primary phase formed of an alkali niobate-based perovskite oxide represented by a compositional formula $(A1_aM1_b)_c(Nb_{d1}, Mn_{d2}, M2_{d3})O_{3+e}$, wherein the composition contains Na and K as element A1 or contains three elements of Na, K, and Li as element A1; element M1 represents at least one species among Ba, Ca, and Sr; element M2 represents at least one species of Ti and Zr; the following conditions: 0<a<1, 0<b<1, a+b=1, 0.80<c<1.10, 0<d1<1, 0<d2<1, 0<d3<1, and d1+d2+d3=1, are satisfied; and e represents a value showing the degree of deficiency or excess of oxygen, and which satisfies the condition: b/(d2+d3)>1.0.

2. The lead-free piezoelectric ceramic composition according to claim 1, which further comprises a secondary phase formed of one member of an oxide represented by compositional formula $A2_{1-x}Ti_{1-x}Nb_{1+x}O_5$, wherein element A2 is at least one species among the alkali metals, and the condition: 0≤x≤0.15 is satisfied, and an oxide represented by compositional formula $A3Ti_3NbO_9$, wherein element A3 is at least one species among the alkali metals.

3. The lead-free piezoelectric ceramic composition according to claim 2, wherein the primary phase contains crystal grains of the alkali niobate-based perovskite oxide having a mean grain size of 0.3 μm or more and 3.5 μm or less.

4. A piezoelectric element having a piezoelectric body and an electrode in contact with the piezoelectric body, the piezoelectric body being formed of the lead-free piezoelectric ceramic composition as recited in claim 3.

5. The lead-free piezoelectric ceramic composition according to claim 2, wherein the primary phase contains crystal grains of the alkali niobate-based perovskite oxide having a mean grain size of 0.3 μm or more and 1.1 μm or less.

6. A piezoelectric element having a piezoelectric body and an electrode in contact with the piezoelectric body, the piezoelectric body being formed of the lead-free piezoelectric ceramic composition as recited in claim 5.

7. A piezoelectric element having a piezoelectric body and an electrode in contact with the piezoelectric body, the piezoelectric body being formed of the lead-free piezoelectric ceramic composition as recited in claim 2.

8. The lead-free piezoelectric ceramic composition according to claim 1, wherein the primary phase contains crystal grains of the alkali niobate-based perovskite oxide having a mean grain size of 0.3 μm or more and 3.5 μm or less.

9. A piezoelectric element having a piezoelectric body and an electrode in contact with the piezoelectric body, the piezoelectric body being formed of the lead-free piezoelectric ceramic composition as recited in claim 8.

10. The lead-free piezoelectric ceramic composition according to claim 1, wherein the primary phase contains crystal grains of the alkali niobate-based perovskite oxide having a mean grain size of 0.3 μm or more and 1.1 μm or less.

11. A piezoelectric element having a piezoelectric body and an electrode in contact with the piezoelectric body, the piezoelectric body being formed of the lead-free piezoelectric ceramic composition as recited in claim 10.

12. A piezoelectric element having a piezoelectric body and an electrode in contact with the piezoelectric body, the piezoelectric body being formed of the lead-free piezoelectric ceramic composition as recited in claim 1.

* * * * *